United States Patent
Liu et al.

(10) Patent No.: US 7,961,063 B2
(45) Date of Patent: Jun. 14, 2011

(54) BALUN SIGNAL TRANSFORMER AND METHOD OF FORMING

(75) Inventors: Lianjun Liu, Chandler, AZ (US); Jonathan K. Abrokwah, Chandler, AZ (US); Olin L. Hartin, Phoenix, AZ (US); Qiang Li, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 202 days.

(21) Appl. No.: 12/183,755

(22) Filed: Jul. 31, 2008

(65) Prior Publication Data

US 2010/0026411 A1    Feb. 4, 2010

(51) Int. Cl.
*H03H 7/42* (2006.01)
*H01P 5/12* (2006.01)

(52) U.S. Cl. .............................. 333/26; 333/4
(58) Field of Classification Search .............. 333/25, 333/26, 100, 4
See application file for complete search history.

(56) References Cited

U.S. PATENT DOCUMENTS

| | | | |
|---|---|---|---|
| 6,052,039 A * | 4/2000 | Chiou et al. | 333/100 |
| 6,952,142 B2 * | 10/2005 | Guitton et al. | 333/25 |
| 7,683,733 B2 * | 3/2010 | Li et al. | 333/25 |
| 2005/0040910 A1 | 2/2005 | Rijks | |
| 2007/0063786 A1 | 3/2007 | Shih | |

FOREIGN PATENT DOCUMENTS

JP    07202523 A    8/1995

OTHER PUBLICATIONS

International Application No. PCT/US2009/043909, International Search Report and Written Opinion dated Dec. 29, 2009.
J. Mondal, et al., "Design and Characterization of an Integrated Passive Balun for Quad Band GSM Applications", The 56th ECTC, pp. 534-540, San Diego.
L. Liu, et al., "Compact Harmonic Filter Design and Fabrication Using IPD Technology", IEEE, vol. 30, No. 4, Dec. 2007.
U.S. Appl. No. 11/737,270, filed Apr. 19, 2007.

* cited by examiner

*Primary Examiner* — Dean O Takaoka

(57) ABSTRACT

A balanced-unbalanced (balun) signal transformer includes an unbalanced port, a balanced port coupled to the unbalanced port, the balanced port comprising a first terminal and a second terminal, a first capacitor coupled to the first terminal, a first inductor coupled to ground and the first capacitor, a second capacitor coupled to the second terminal, and a second inductor coupled to ground and the second capacitor. The transformer may also include a third capacitor coupled to a terminal of the unbalanced port; and a third inductor coupled to the third capacitor and the third terminal.

18 Claims, 3 Drawing Sheets

BALUN SIGNAL TRANSFORMER AND METHOD OF FORMING

BACKGROUND

1. Field

The present invention relates generally to balun signal transformers. More specifically, the present invention relates to balun signal transformers that have high second harmonic rejection.

2. Related Art

A balun (balanced-to-unbalanced) signal transformer is a passive electronic circuit that functions to convert an unbalanced signal (i.e., unbalanced in relation to ground) into balanced signals (i.e., balanced in relation to ground) and vice versa of converting balanced signals into an unbalanced signal. A signal incoming to an unbalanced port of the balun transformer may be divided between two balanced ports of the balun transformer providing signals which have the same amplitude but phases differing by one hundred and eighty degrees in relation to one another. For example, baluns may be used in transmitting circuits and receiving circuits of wireless or cable communications systems and for construction of balanced amplifiers, mixers, voltage controlled oscillators, and antenna systems.

In manufacturing, process variations occur that may affect circuit performance and result in yield loss. For balun transformers circuit performance involves insertion loss, common mode rejection, and second harmonic suppression. Insertion loss is defined as the amount of signal loss occurring in the balun transformer. Common mode rejection is the phenomenon whereby a signal common to two lines gets cancelled at its destination. Second harmonic suppression is the phenomenon whereby signals at frequencies that are two times the fundamental frequencies are rejected to improve performance. Therefore, there is a need for the balun to have a large tolerance for processing variation so that circuit performance and yield are not diminished.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A system for transforming signals includes a balun (balanced-to-unbalanced) signal transformer interposed between an unbalanced device and a balanced device. The balun signal transformer includes a transformer, which may be symmetric, having a balanced port and an unbalanced port. In one embodiment, two tuned circuits are coupled to the balanced port. The tuned circuits combined with the transformer produce offset resonance, which results in a wider band width for second harmonic suppression. Thus, the process variation tolerance is improved, especially with respect to capacitor variation tolerance of the manufacturing process. As a result, yield and circuit performance are not diminished and may be improved.

Figure 1:
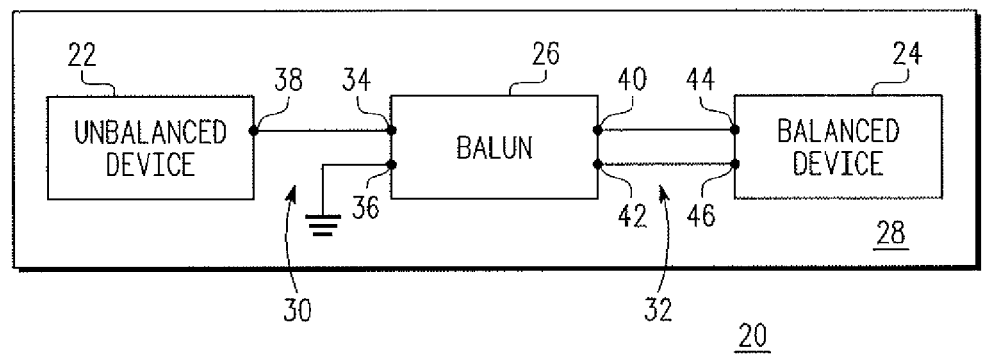
FIG. 1 shows a block diagram of a system for transforming a signal in accordance with an embodiment of the present invention.

FIG. 1 shows a block diagram of a system 20 for transforming a signal in accordance with one embodiment of the present invention. System 20 includes an unbalanced device 22, a balanced device 24, and a balun signal transformer 26 interposed between unbalanced device 22 and balanced device 24. Unbalanced device 22 may be any of a number of devices or components that provides a single ended output signal or receives a single ended input signal. Balanced device 24 may be any of a number of devices or components that receives a differential input signal or provides a differential output signal. System 20 may be formed on a substrate 28 as an integrated circuit. Alternatively, unbalanced device 22, balanced device 24, and balun signal transformer 26 may be formed utilizing a combination of discrete components or as integrated circuits on discrete substrates. Additional, different, or fewer components may be provided.

Substrate 28 may be silicon, gallium arsenide (GaAs), combinations thereof, or other known or upcoming semiconductor materials. Substrate 28 may be used with an integrated passive device process, complementary metal-oxide semiconductor (CMOS) integrated circuit process, or other semiconductor processes for forming system 20 on a chip. Substrate 28 defines a circuit plane where etching, deposition, or other techniques are used to form system 20. Although balun signal transformer 26 is described as being formed on a substrate utilizing a semiconductor process technology, in other embodiments, balun signal transformer 26 may be implemented utilizing a combination of discrete passive components.

Balun signal transformer 26 includes an unbalanced external port 30 and a balanced external port 32. Unbalanced external port 30 includes a pair of unbalanced terminals 34 and 36. In one embodiment, terminal 34 is connected to a single ended port 38 of unbalanced device 22 and terminal 36 may be terminated as ground. External balanced port 32 includes a pair of balanced ports 40 and 42 and balanced device 24 includes a corresponding pair of differential ports 44 and 46. In one embodiment, port 40 is connected to differential port 44 and port 42 is connected to differential port 46. The term "external" in connection with ports 30 and 32 is utilized herein to refer to input/output sections that convey signals to and from balun signal transformer 26.

Balun signal transformer 26 provides coupling between unbalanced device 22 and balanced device 24. More specifically, balun signal transformer 26 may be used for conversion between an unbalanced input signal from unbalanced device 22 to a balanced output signal conveyed to balanced device 24. Additionally, balun signal transformer 26 may be used for conversion between a balanced input signal from balanced device 24 to an unbalanced output signal conveyed to unbalanced device 22.

Figure 2:
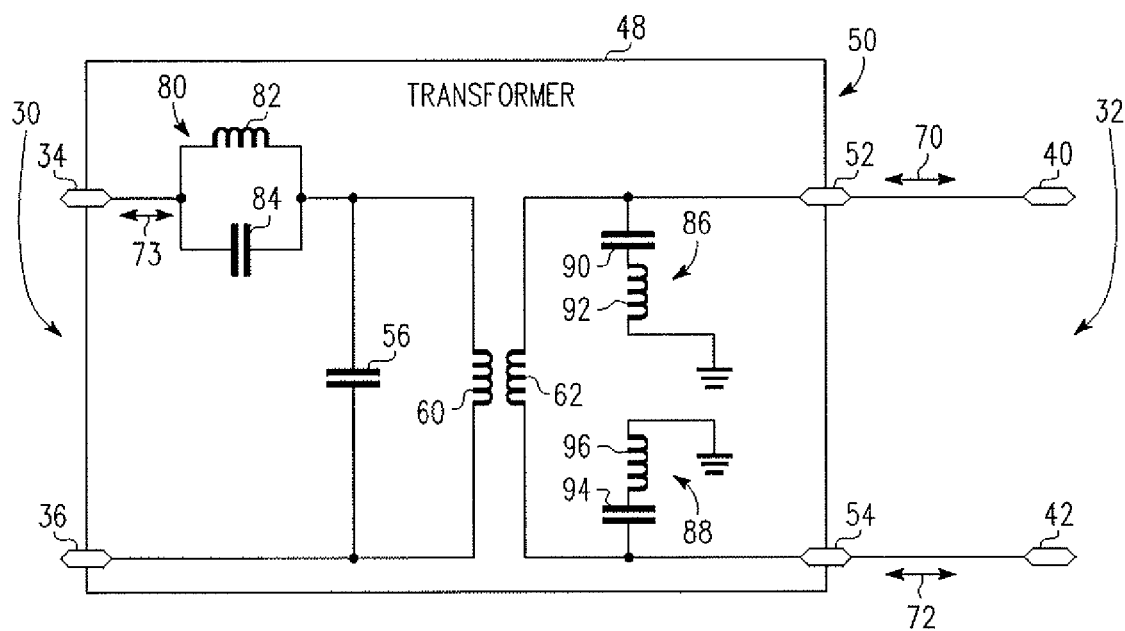
FIG. 2 shows an embodiment of a circuit schematic for balun signal transformer incorporated within the system of FIG. 1.

FIG. 2 shows an embodiment of a circuit schematic for balun signal transformer 26 incorporated within system 20 (FIG. 1). Balun signal transformer 26 includes a transformer, or balun, 48 having unbalanced terminals 34 and 36 that make up unbalanced external port 30. Transformer 48 further includes a balanced port 50 formed by terminals 52 and 54. Transformer 48 includes two or more inductors, which may also be referred to as windings, coils, or folds 60, 62. In one embodiment, terminals 34 and 36 of unbalanced port 30 are formed at opposing ends of inductor 60. In the illustrated embodiment, a second harmonic rejection circuit 80, which may include inductor 82 and capacitor 84, is connected between terminal 34 and an end of inductor 60. Terminals 52 and 54 of balanced port 50 are formed at opposing ends of inductor 62. In addition, terminal 52 is connected to port 40 of balanced external port 32. Terminal 54 of port 50 is connected to port 42 of balanced external port 32.

In addition in one embodiment, transformer 48 includes a tuning capacitor 56 interposed between unbalanced terminals 34 and 36. In the illustrated embodiment, tuning capacitor 56 is connected between the second harmonic rejection circuit 80 and terminal 36. In addition, the transformer 48 includes tuned circuits 86 and 88 interposed between terminals 52 and 54. Tuned circuit 86 in one embodiment includes a capacitor 90 connected to inductor 62 and inductor 92, which is connected to ground. Hence, the tuned circuit 86 may be a shunt LC circuit. Similarly, tuned circuit 88 in one embodiment includes a capacitor 94 connected to the inductor 62 and inductor 96, which is connected to ground. Hence, the tuned circuit 88 may be a shunt LC circuit. In other words, the tuned circuits 86 and 88 bridge the differential ports of the inductor 62. The tuned circuits 86 and 88 are independently tuned to have the same or different values so as to produce offset resonance. The offset resonance results in a wider bandwidth for second harmonic suppression, which improves process variation tolerance. As will be better understood after further discussion, the presence of the tuned circuits 86 and 88 results in two second harmonic notches that can be viewed as one wide notch, which increases process variation tolerance.

By way of illustration, when unbalanced external port 30 serves as input from unbalanced device 22 (FIG. 1) and balanced external port 32 serves as output to balanced device 24 (FIG. 1), a method of transforming a signal, represented by bidirectional arrow 73, from unbalanced device 22 entails transforming, or dividing the signal 73 with transformer 48 to form signal component 70 provided at terminal 52 and signal component 72 provided at terminal 54. A phase of signal component 72 is adjusted to balance with signal component 70 using balun transformer 48. Signal component 70 and phase shifted signal component 72 are output from ports 40 and 42 of balanced external port 32 to balanced device 24 (FIG. 1).

By way of another illustration, when balanced external port 32 serves as input from balanced device 24 and unbalanced external port 30 serves as output to unbalanced device 22, a method of transforming a signal entails receiving the signal as first and second signal components 70 and 72 at ports 40 and 42. A phase of signal component 72 is adjusted to balance with signal component 70 using balun transformer 48. Signal component 70 and phase shifted signal component 72 are input to transformer 48 where they are transformed to an output signal, i.e., signal 73. Signal 73 is subsequently output from transformer 48 to unbalanced device 22.

Figure 3:
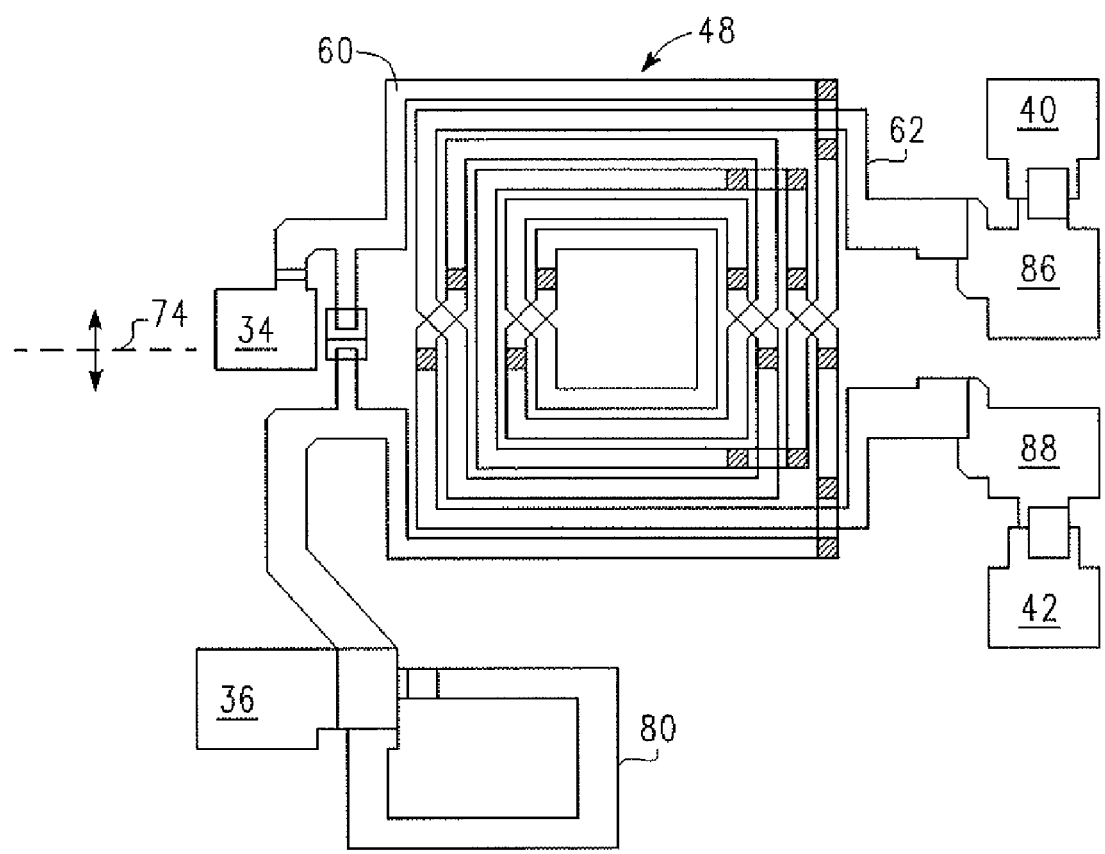
FIG. 3 shows a top plan view of the balun signal transformer of FIG. 2.

FIG. 3 shows a top plan view of the balun signal transformer 26 including transformer 48 and tuning circuits 86 and 88. Balun signal transformer 26, implemented as an integrated circuit mounted on substrate 28, may be a stand alone device. Although in other embodiments, transformer 26 may be combined with other circuits on substrate 28 as mentioned above. In this example, balun signal transformer 26 has been produced utilizing an integrated passive device process technology. As used herein, an integrated passive device (IPD) is a passive electronic device or a passive electronic component that does not require a source of energy for its operation and that can be fabricated using semiconductor process technology. An IPD can be produced with very high precision, excellent reproducibility, and low cost in high quantities by utilizing semiconductor wafer processing technologies. As discussed above, the presence of the tuned circuits 86 and 88 results in the improved processing variation tolerance. Thus, a layout of balun signal transformer 26 represents an IPD realization, where all of the depicted elements are formed on a surface of substrate 28.

In the illustrated embodiment of FIG. 3, terminals 34 and 36 of unbalanced external port 30 (FIG. 1) are shown as pads that may interconnect with other components, such as unbalanced device 22 (FIG. 1) and ground, via bond wires (not shown). Similarly, ports 40 and 42 of balanced external port 32 (FIG. 1) are shown as pads that may interconnect with other components, such as balanced device 24 (FIG. 1), via bond wires. In this example, inductor 60 is an input having a trace arranged on substrate 28 that forms two turns and inductor 62 is an output having a trace arranged on substrate 28 that forms four turns. Accordingly, transformer 48 may produce an impedance transformation of one to four, for example, from fifty ohms to two hundred ohms.

Inductors 60 and 62 are symmetrically arranged on substrate 28 and hence, the transformer 48 is a symmetric transformer. This symmetry is represented by a bidirectional arrow 74 indicating a top half of symmetric transformer 48 is symmetric, or identical, to a bottom half of symmetric transformer 48. Inclusion of the second harmonic rejection circuit 80 results in an asymmetric configuration, which results in an improved second harmonic rejection. However, the second harmonic rejection circuit 80 may not be present as the benefits of the circuit may be outweighed by the additional space that the circuitry adds to the balun signal transformer 26.

Figure 4:
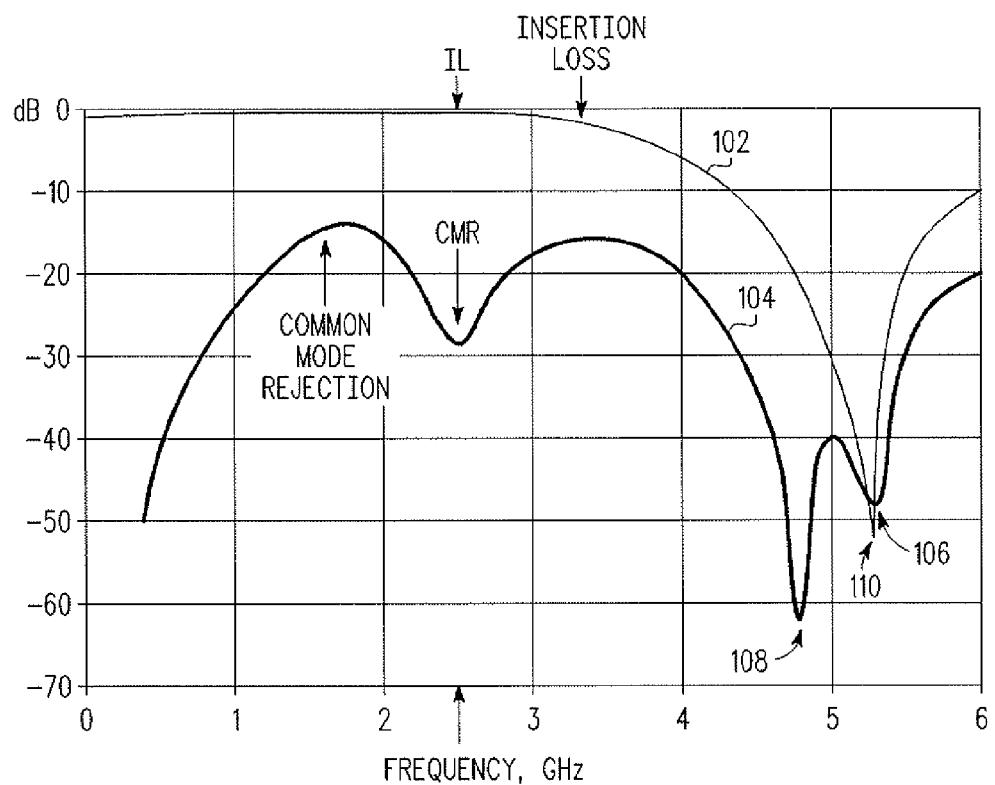
FIG. 4 shows a chart of exemplary electrical characteristics of the balun signal transformer.

FIG. 4 shows a chart 100 of exemplary electrical characteristics of balun signal transformer 26. Chart 100 includes an insertion loss curve 102, in decibels, relative to frequency. Simulations reveal that at 2.45 GHz, there is good insertion loss as evidenced by the insertion loss curve 102 being close to 0 dB at 2.45 GHz. It is desirable to have the insertion loss curve as close as possible to 0 dB, because the closer the curve is to 0 dB the less the signal decreases when being transported from the input to the output. Notch 106 in the insertion loss curve 102 results in excellent second harmonic rejection of the differential signal. It is desirable to have the notch 106 as negative as possible.

Chart 100 also includes a common mode rejection (CMR) curve 104, in decibels, relative to frequency. The notch in the CMR curve 104 at 2.45 GHz is the common mode rejection of the transformer 26 at fundamental frequency. Notches 110 and 108 together are the resonators which form the second harmonic rejection for the common mode signal. Simulations reveal that the two notches 110 and 108 can be formed relatively close to each other in frequency so that they are like one wide notch and can be formed having sufficiency negative dB values. In one embodiment, the notches 110 and 108 should be less than approximately −35 dB. For example, a dB value less than −20 dB (e.g., −30 dB, −40 dB, etc.) is desirable. In addition, a wide notch is desirable because it corresponds to the fact that the transformer can be manufactured by a process with a high variation, such as a capacitance variation (e.g., a capacitance variation greater than ±10%, or more specifically a capacitance variation of approximately ±15%).

Some embodiments include the following:

Item 1. A balanced-unbalanced (balun) signal transformer comprising: an unbalanced port; a balanced port coupled to the unbalanced port, the balanced port comprising a first terminal and a second terminal; a first capacitor coupled to the first terminal; a first inductor coupled to ground and the first capacitor; a second capacitor coupled to the second terminal; and a second inductor coupled to ground and the second capacitor. Item 2. The transformer of item 1, wherein the unbalanced port comprises a third terminal and the transformer further comprises: a third capacitor coupled to the third terminal; and a third inductor coupled to the third capacitor and the third terminal. Item 3. The transformer of item 1, wherein the balanced-unbalanced signal transformer comprises a symmetric transformer. Item 4. The transformer of item 1, further comprising a substrate and wherein the transformer is implemented as an integrated circuit formed on the substrate. Item 5. The transformer of item 1, wherein the transformer is implemented with a combination of discrete passive components. Item 6. The transformer of item 1, further comprising a third inductor, wherein the first capacitor and the second capacitor are connected to the third inductor. Item 7. The transformer of item 6, further comprising: a fourth inductor, wherein the unbalanced port is formed by third and fourth terminals of the fourth inductor. Item 8. The transformer of item 7, wherein the third inductor is capable of inducing a current through the fourth inductor. Item 9. The transformer of item 1 further comprising: a first external port, wherein the first capacitor is coupled to the first external port through the first terminal; and a second external port, wherein the second capacitor is coupled to the second external port through the second terminal. Item 10. The transformer of item 9, wherein the first external port and the second external port are coupled to a balanced device.

Item 11. A balanced-unbalanced (balun) signal transformer comprising: an unbalanced port; a balanced port coupled to the unbalanced port, the balanced port comprising a first terminal and a second terminal; a first capacitor having a third terminal and a fourth terminal, wherein the third terminal is connected to the first terminal of the balanced port; a first inductor having a fifth terminal and a sixth terminal, wherein the fifth terminal of the first inductor is connected to the fourth terminal of the first capacitor and the sixth terminal of the first inductor is connected to ground; a second capacitor having a seventh terminal and an eighth terminal, wherein the seventh terminal of the second capacitor is connected to the second terminal of the balanced port; and a second inductor having a ninth terminal and a tenth terminal, wherein the ninth terminal of the first inductor is connected to the eighth terminal of the second capacitor and the tenth terminal of the second inductor is connected to ground. Item 12. The transformer of item 11, further comprising: a third inductor connected to the third terminal of the first capacitor and the seventh terminal of the second capacitor Item 13. The transformer of item 12, further comprising: a fourth inductor capable of inducing a current through the third inductor and a third capacitor connected to fourth inductor. Item 14. The transformer of item 13, further comprising: a fourth capacitor is connected to the third capacitor; and a third inductor connected to the fourth capacitor. Item 15. The transformer of item 13, further comprising a substrate and wherein the transformer is implemented as an integrated circuit formed on the substrate. Item 16. The transformer of item 13, wherein the transformer is implemented with a combination of discrete passive components. Item 17. The transformer of item 1 further comprising: a first external port, wherein the first capacitor is coupled to the first external port through the first terminal; and a second external port, wherein the second capacitor is coupled to the second external port through the second terminal. Item 18. The transformer of item 9, wherein the first external port and the second external port are coupled to a balanced device.

Item 19. A method of forming a balanced-unbalanced (balun) signal transformer comprising: providing an unbalanced port; providing a balanced port coupled to the unbalanced port, the balanced port comprising a first terminal and a second terminal; providing a first capacitor coupled to the first terminal; providing a first inductor coupled to ground and the first capacitor; providing a second capacitor coupled to the second terminal; and providing a second inductor coupled to ground and the second capacitor. Item 20. The method of item 19, further comprising: providing a third capacitor coupled to a third terminal, wherein the unbalanced port comprises a third terminal; and providing a third inductor coupled to the third capacitor and the third terminal.

By now it should be appreciated that there has been provided a balun transformer that can be manufactured using a process that has a high variation without sacrificing circuit performance or yield. The balun transformer includes a transformer having a balanced port and an unbalanced port and two tuned circuits are coupled to the balanced port. The tuned circuits produce offset resonance, which results in a wider band width for second harmonic suppression.

Although the invention is described with reference to specific embodiments, various modifications and changes can be made without departing from the scope of the present invention as set forth in the claims below. For example, the balun signal transformer 26 may further include an inductor 64 connected to terminal 54 to improve common mode rejection. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A balanced-unbalanced (balun) signal transformer comprising:
an unbalanced port; a balanced port coupled to the unbalanced port, the balanced port comprising a first terminal and a second terminal; a first capacitor coupled to the first terminal; a first inductor coupled to ground and the first capacitor; a second capacitor coupled to the second terminal; a second inductor coupled to ground and the second capacitor, a third inductor, wherein the first capacitor and the second capacitor are connected to the third inductor; a fourth inductor, wherein the unbalanced port is formed by third and fourth terminals of the fourth inductor.

2. The transformer of claim 1, wherein the unbalanced port comprises a third terminal and the transformer further comprises:
a third capacitor coupled to the third terminal; and
a third inductor coupled to the third capacitor and the third terminal.

3. The transformer of claim 1, wherein the balanced-unbalanced signal transformer comprises a symmetric transformer.

4. The transformer of claim 1, further comprising a substrate and wherein the transformer is implemented as an integrated circuit formed on the substrate.

5. The transformer of claim 1, wherein the transformer is implemented with a combination of discrete passive components.

6. The transformer of claim 1, wherein the third inductor is capable of inducing a current through the fourth inductor.

7. The transformer of claim 1 further comprising:
a first external port, wherein the first capacitor is coupled to the first external port through the first terminal; and
a second external port, wherein the second capacitor is coupled to the second external port through the second terminal.

8. The transformer of claim 7, wherein the first external port and the second external port are coupled to a balanced device.

9. A method of forming a balanced-unbalanced (balun) signal transformer comprising: providing an unbalanced port; providing a balanced port coupled to the unbalanced port, the balanced port comprising a first terminal and a second terminal; providing a first capacitor coupled to the first terminal; providing a first inductor coupled to ground and the first capacitor; providing a second capacitor coupled to the second terminal; providing a second inductor coupled to ground and the second capacitor; and providing a third inductor, wherein the first capacitor and the second capacitor are connected to the third inductor; providing a fourth inductor, wherein the unbalanced port is formed by third and fourth terminals of the fourth inductor.

10. The method of claim 9, further comprising:
providing a third capacitor coupled to a third terminal, wherein the unbalanced port comprises a third terminal.

11. A balanced-unbalanced (balun) signal transformer comprising:
an unbalanced port, the unbalanced port having a first terminal and a second terminal;
a balanced port coupled to the unbalanced port, the balanced port comprising a third terminal and a fourth terminal;
a first capacitor coupled to the third terminal;
a first inductor coupled to ground and the first capacitor;
a second capacitor coupled to the fourth terminal;
a second inductor coupled to ground and the second capacitor;
a third capacitor coupled to the first terminal and the second terminal; and
a third inductor coupled to the first terminal and the second terminal, wherein the third capacitor and the third inductor are coupled in parallel.

12. The transformer of claim 11, wherein the balanced-unbalanced signal transformer comprises a symmetric transformer.

13. The transformer of claim 11, further comprising a substrate and wherein the transformer is implemented as an integrated circuit formed on the substrate.

14. The transformer of claim 11, wherein the transformer is implemented with a combination of discrete passive components.

15. The transformer of claim 11, further comprising a fourth inductor, wherein the unbalanced port is formed by third and fourth terminals of the fourth inductor.

16. The transformer of claim 11, wherein the third inductor is capable of inducing a current through the fourth inductor.

17. The transformer of claim 11 further comprising:
a first external port, wherein the first capacitor is coupled to the first external port through the first terminal; and
a second external port, wherein the second capacitor is coupled to the second external port through the second terminal.

18. The transformer of claim 17, wherein the first external port and the second external port are coupled to a balanced device.

* * * * *